(12) United States Patent
Aga et al.

(10) Patent No.: US 8,728,912 B2
(45) Date of Patent: May 20, 2014

(54) METHOD FOR MANUFACTURING SOI WAFER

(75) Inventors: Hiroji Aga, Annaka (JP); Isao Yokokawa, Annaka (JP); Satoshi Oka, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/990,883

(22) PCT Filed: Nov. 18, 2011

(86) PCT No.: PCT/JP2011/006430
§ 371 (c)(1),
(2), (4) Date: May 31, 2013

(87) PCT Pub. No.: WO2012/086122
PCT Pub. Date: Jun. 28, 2012

(65) Prior Publication Data
US 2013/0316522 A1    Nov. 28, 2013

(30) Foreign Application Priority Data

Dec. 20, 2010   (JP) ................................ 2010-283574

(51) Int. Cl.
*H01L 21/30*   (2006.01)
*H01L 21/46*   (2006.01)

(52) U.S. Cl.
USPC ................... 438/458; 438/455; 257/E21.568; 257/E21.122; 257/E21.57

(58) Field of Classification Search
CPC ................. H01L 21/76254; H01L 21/76251; H01L 21/76243; H01L 21/2007; H01L 21/02032
USPC ................. 438/455-459, 481, 977, 406, 407; 257/E21.568, E21.122, E21.567, 257/E21.563, E21.57
See application file for complete search history.

(56) References Cited

U.S. PATENT DOCUMENTS

| 6,284,629 | B1 | 9/2001 | Yokokawa et al. |
| 2008/0020514 | A1 | 1/2008 | Okuda et al. |
| 2008/0315349 | A1 | 12/2008 | Takei et al. |
| 2009/0186464 | A1* | 7/2009 | Morimoto et al. ............ 438/459 |
| 2010/0129993 | A1 | 5/2010 | Yokokawa et al. |

FOREIGN PATENT DOCUMENTS

| JP | A-2000-30995 | 1/2000 |
| JP | A-2006-270039 | 10/2006 |

(Continued)

OTHER PUBLICATIONS

International Preliminary Report on Patentability issued in International Patent Application No. PCT/JP2011/006430 dated Jun. 25, 2013.

(Continued)

*Primary Examiner* — Mary Wilczewski
*Assistant Examiner* — Erik T Peterson
(74) *Attorney, Agent, or Firm* — Oliff PLC

(57) ABSTRACT

The present invention is directed to a method for manufacturing an SOI wafer, the method by which treatment that removes the outer periphery of a buried oxide film to obtain a structure in which a peripheral end of an SOI layer of an SOI wafer is located outside a peripheral end of the buried oxide film, and, after heat treatment is performed on the SOI wafer in a reducing atmosphere containing hydrogen or an atmosphere containing hydrogen chloride gas, an epitaxial layer is formed on a surface of the SOI layer. As a result, there is provided a method that can manufacture an SOI wafer having a desired SOI layer thickness by performing epitaxial growth without allowing a valley-shaped step to be generated in an SOI wafer with no silicon oxide film in a terrace portion, the SOI wafer fabricated by an ion implantation delamination method.

2 Claims, 5 Drawing Sheets

(56) References Cited

FOREIGN PATENT DOCUMENTS

| JP | A-2008-28070 | 2/2008 |
| JP | A-2009-27124 | 2/2009 |

OTHER PUBLICATIONS

Sep. 10, 2013 Office Action issued in JP 2010-283574 (with partial English-language Translation).

* cited by examiner

METHOD FOR MANUFACTURING SOI WAFER

TECHNICAL FIELD

The present invention relates to a method for manufacturing an SOI wafer, the method by which an epitaxial layer is formed on an SOI layer of an SOI wafer fabricated by an ion implantation delamination method.

BACKGROUND ART

In recent years, as a wafer which is highly useful for a bipolar device and a power device, a relatively thick thick-film SOI wafer with an SOI layer having a film thickness of several μm to several-ten μm has been greatly expected.

However, when manufacturing a high-quality SOI wafer that is required to have an SOI layer having a film thickness of several μm and a thickness tolerance of about ±0.1 μm by using wafers bonding method, the method for reducing a film thickness of a bond wafer (a wafer for forming an SOI layer) by grinding/polishing can obtain radial uniformity of at most about ±0.3 μm only with respect to a target film thickness even though a highly accurate polishing technique is utilized, irregularities in film thickness of the SOI layer are considerable, and there is a limit to the film thickness uniformity.

Therefore, as a method for realizing this, there is Patent Document 1. In this Patent Document 1, a thin SOI layer is formed by the ion implantation delamination method that can relatively easily obtain the film thickness uniformity of SOI layer that is ±0.01 μm or less, and epitaxial growth is then performed on this SOI layer, whereby the thickness of the SOI layer is increased.

However, in this case, when an SOI wafer is fabricated by forming an oxide film on a base wafer (a wafer which becomes a support wafer) in advance and performing bonding with consideration given to the warpage of the SOI wafer, since the oxide film in a peripheral terrace portion (the unbonded portion) of the SOI wafer is in an exposed state, if epitaxial growth is performed on the entire surface of an SOI layer in this state, polysilicon grows on the oxide film in the terrace portion, causing particle contamination or the like in subsequent processes.

In general, to prevent the growth of the polysilicon, epitaxial growth is performed after removing the oxide film in the terrace portion by immersing the SOI wafer in an aqueous HF solution. However, when a back surface oxide film for preventing warpage is left on the base wafer, since the film thickness of the back surface oxide film is also reduced, larger warpage occurs in an SOI wafer to be manufactured.

To solve such a problem, there is a method by which epitaxial growth is performed after completely removing only the oxide film in the terrace portion by a method such as performing HF spin cleaning as in Patent Document 2 to prevent the back surface oxide film for preventing warpage in the SOI wafer from being unnecessarily reduced.

CITATION LIST

Patent Literature

Patent Document 1: Japanese Unexamined Patent publication (Kokai) No.2000-30995
Patent Document 2: Japanese Unexamined Patent publication (Kokai) No.2006-270039

DISCLOSURE OF INVENTION

Problem to be Solved by the Invention

When an SOI wafer is fabricated by the ion implantation delamination method, to prevent channeling at the time of ion implantation, ion implantation is generally performed after a thin oxide film is formed on a surface of a bond wafer. In this case, when a thick buried oxide film is required or consideration is given to the above-mentioned problem of warpage, an oxide film is sometimes formed also on a base wafer. When a relatively thin buried oxide film of 200 nm or less is required, bonding with the base wafer is often performed after forming an oxide film only on the bond wafer.

In that case, an oxide film is not formed in a terrace portion of the SOI wafer just after delamination, and a peripheral end of an SOI layer of the fabricated SOI wafer and a peripheral end of a buried oxide film are located in almost the same position (a radial position). Therefore, when an oxide film is formed only on the bond wafer, etching etc. of the oxide film in the terrace portion, the etching etc. which is performed when the oxide film is formed on the base wafer, is not performed because it is not necessary.

However, when the method by which the thickness of the SOI layer is increased as in Patent Document 1 is applied to such an SOI wafer, at the time of heat treatment in a reducing atmosphere containing hydrogen or an atmosphere containing hydrogen chloride gas before epitaxial growth, while etching proceeds from an end face on the outer periphery of the SOI layer, almost no etching occurs on the outer periphery of a BOX layer (a buried oxide film).

Therefore, when the above-described heat treatment is completed (immediately before the epitaxial growth is performed), the buried oxide film is exposed on the whole circumference of the outer periphery of the SOI layer.

In FIG. 7, a schematic sectional view of a boundary portion of an SOI layer and a terrace portion when epitaxial growth is performed in the above-described structure is shown. When epitaxial growth is performed on an SOI wafer with the above-described structure, the following new problem is revealed: even when epitaxial growth is performed under conditions that do not allow polysilicon to be grown in a portion in which a buried oxide film 22 is exposed, due to the presence of the exposed buried oxide film 22 between an SOI layer 21 and a terrace portion 23, an epitaxial layer 20 grown from the end face of the SOI layer 21 and an epitaxial layer 24 grown from the terrace portion 23 do not easily connect to each other as a laterally continuous layer, and a valley-shaped step 25 (hereinafter also referred to as an epi-valley) is generated in that portion.

In such a case, the epitaxial layer 20 grown from the SOI layer 21 and the epitaxial layer 24 from the terrace portion 23 make contact with each other, and this portion becomes a source of dust and causes particle contamination in subsequent processes.

The present invention has been made in view of the problems described above, and an object thereof is to provide a method by which an SOI wafer having a desired SOI layer thickness can be manufactured by performing epitaxial growth on an SOI wafer with no silicon oxide film in a terrace portion that is fabricated by an ion implantation delamination method, without allowing the above-described epi-valley to be generated.

Means for Solving Problem

To attain the above-described object, the present invention provides a method for manufacturing an SOI wafer, the method by which a silicon oxide film is formed on a surface of a bond wafer made of a silicon single crystal, an ion implanted layer is formed inside the bond wafer by implanting at least one gas ion of a hydrogen ion and a rare gas ion through the silicon oxide film, and, after an ion implanted surface of the bond wafer and a surface of a base wafer made of a silicon single crystal are bonded through the silicon oxide film, the bond wafer is delaminated at the ion implanted layer to fabricate the SOI wafer having no oxide film in a terrace portion of the periphery of the base wafer and using the silicon oxide film as a buried oxide film, treatment that removes the outer periphery of the buried oxide film is performed in such a way as to obtain a structure in which a peripheral end of an SOI layer of the SOI wafer is located outside a peripheral end of the buried oxide film, and, after heat treatment is performed on the SOI wafer in a reducing atmosphere containing hydrogen or an atmosphere containing hydrogen chloride gas, an epitaxial layer is formed on a surface of the SOI layer.

With such a manufacturing method of the present invention, since the outer periphery of the buried oxide film has been removed in advance, even when the peripheral end of the SOI layer is etched in the heat treatment, the buried oxide film is not exposed. Therefore, it is possible to form an epitaxial layer satisfactorily on the SOI layer of such an SOI wafer and manufacture a high-quality thick-film SOI wafer that prevents generation of an epi-valley and does not cause particle contamination in subsequent processes.

At this time, it is preferable that the treatment that removes the outer periphery of the buried oxide film is performed by immersing the SOI wafer in an aqueous solution containing HF.

By performing the treatment in this manner, it is possible to perform removal of the outer periphery of the buried oxide film efficiently by a simple method.

Moreover, the present invention provides a method for manufacturing an SOI wafer, the method by which a silicon oxide film is formed on a surface of a bond wafer made of a silicon single crystal, an ion implanted layer is formed inside the bond wafer by implanting at least one gas ion of a hydrogen ion and a rare gas ion through the silicon oxide film, and, after an ion implanted surface of the bond wafer and a surface of a base wafer made of a silicon single crystal are bonded through the silicon oxide film, the bond wafer is delaminated at the ion implanted layer to fabricate the SOI wafer having no oxide film in a terrace portion of the periphery of the base wafer and using the silicon oxide film as a buried oxide film, after heat treatment is performed on the SOI wafer in a reducing atmosphere containing hydrogen or an atmosphere containing hydrogen chloride gas, treatment that removes the buried oxide film exposed on the periphery of an SOI layer of the SOI wafer is performed and an epitaxial layer is then formed on a surface of the SOI layer.

With such a manufacturing method of the present invention, since formation of an epitaxial layer is performed after the buried oxide film that is exposed as a result of the SOI layer having been etched by the heat treatment, it is possible to form an epitaxial layer satisfactorily on the SOI layer and manufacture a high-quality thick-film SOI wafer that prevents generation of an epi-valley and does not cause particle contamination in subsequent processes.

It is preferable that the treatment that removes the buried oxide film exposed on the periphery of the SOI layer is performed by immersing the SOI wafer in an aqueous solution containing HF.

By performing the treatment in this manner, it is possible to perform efficient removal of the outer periphery on which the buried oxide film is exposed by a simple method.

Effect of the Invention

As described above, according to the present invention, it is possible to form an epitaxial layer while preventing generation of a valley-shaped step and manufacture a high-quality thick-film SOI wafer efficiently.

BEST MODE FOR CARRYING OUT THE INVENTION

Hereinafter, the present invention will be described in detail as an example of an embodiment with reference to the drawings, but the present invention is not limited to this example.

Figure 1:
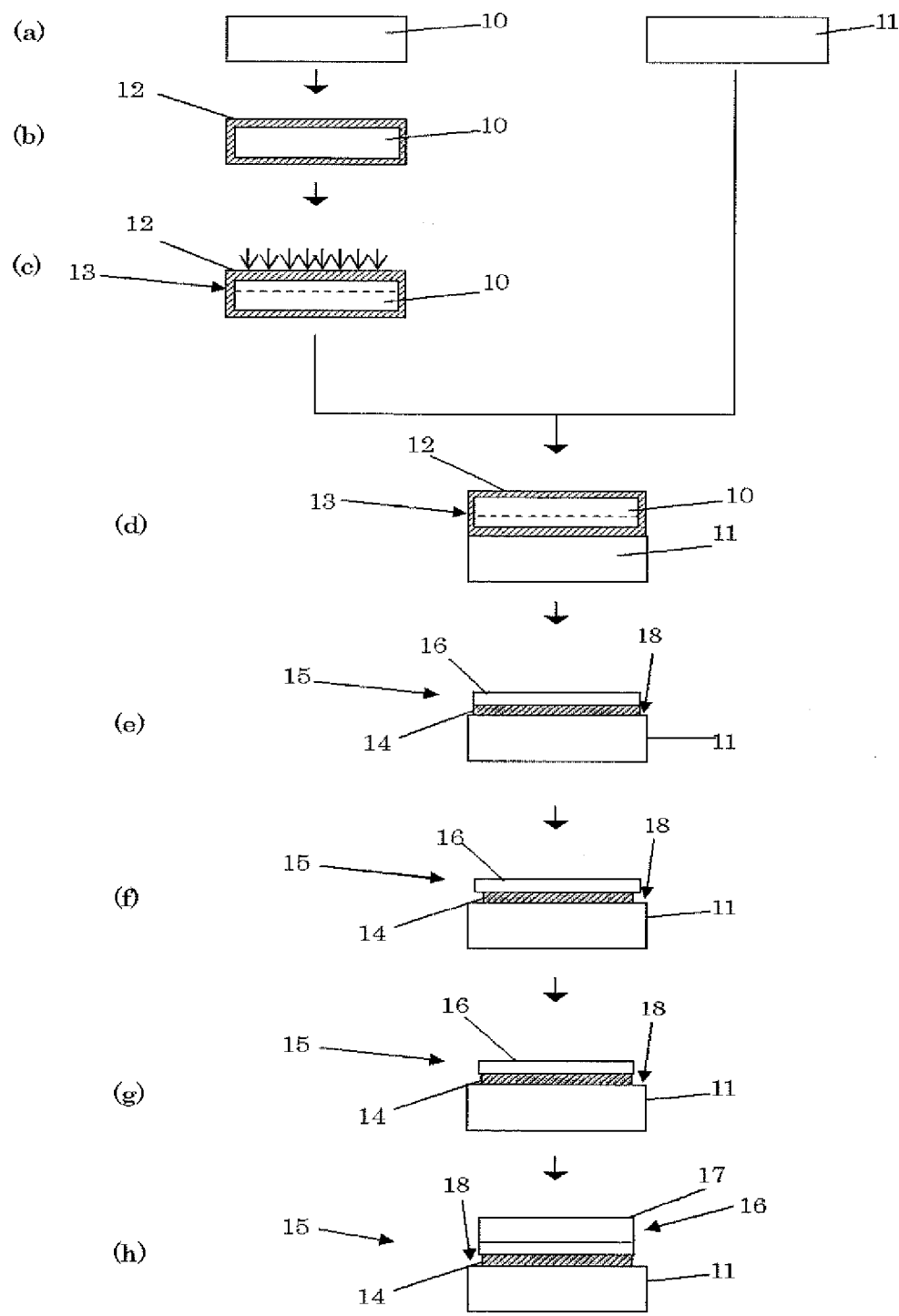
FIG. 1 is a flow diagram of an example of a method for manufacturing an SOI wafer of the present invention.

FIG. 1 is a flow diagram of an example of a method for manufacturing an SOI wafer of the present invention.

In the manufacturing method of the present invention, first, as shown in FIG. 1(a), a bond wafer 10 and a base wafer 11 which are made of a silicon single crystal are prepared.

The bond wafer 10 and the base wafer 11 are not limited to particular wafers as long as they are made of a silicon single crystal. For the purpose of, for example, increasing gettering capability, a silicon single crystal wafer containing a high concentration of dopant may be prepared, and the conductive type thereof may be either n-type or p-type.

Next, as shown in FIG. 1(b), a silicon oxide film 12 is formed on the surface of the bond wafer 10 (an oxide film is not formed on the base wafer 11).

The thickness of the silicon oxide film 12 formed at this time is not limited to a particular thickness, and, as a formation method, for example, the silicon oxide film 12 can be formed by a thermal oxidation method such as wet oxidation. The silicon oxide film 12 thus formed has the effect of preventing channeling at the time of ion implantation in subsequent processes and becomes a buried oxide film 14 after bonding.

Next, as shown in FIG. 1(c), an ion implanted layer 13 is formed inside the bond wafer 10 by implanting at least one gas ion of a hydrogen ion and a rare gas ion through the silicon oxide film 12.

The depth of the ion implanted layer 13 formed at this time is reflected in the thickness of an SOI layer 16 which is formed after delamination. Therefore, by performing ion implantation by controlling implantation energy and the like, it is possible to control the thickness of the SOI layer 16.

Next, as shown in FIG. 1(d), in a clean atmosphere at room temperature, for example, an ion implanted surface of the bond wafer 10 and a surface of the silicon single crystal of the base wafer 11 are bonded through the silicon oxide film 12.

For example, when an SOI wafer having a relatively thin buried oxide film of a thickness of 200 nm or less is manufactured, as in the present invention, an oxide film is not formed on the base wafer, and the silicon oxide film formed on the bond wafer for preventing channeling is used as a buried oxide film.

Next, as shown in FIG. 1(e), by delaminating the bond wafer 10 at the ion implanted layer 13, an SOI wafer 15 that has the SOI layer 16, has no oxide film in a terrace portion 18 on the periphery of the base wafer 11, and uses the silicon oxide film 12 as the buried oxide film 14 is fabricated.

For example, by performing heat treatment on the wafers that have been bonded together in an atmosphere of inert gas such as Ar at a temperature of 500° C. or higher for 30 minutes or longer, it is possible to delaminate bond wafer 10 at the ion implanted layer 13 by the reorientation of crystals and agglomeration of air bubbles.

Incidentally, in the peripheral part of the base wafer and the bond wafer which are to be bonded together, a portion called a polishing sag, the portion which is slightly thinner than the other portion, and a chamfered portion are present, and such portions are not bonded even after bonding and become a unbonded portion, and, due to the presence of the unbonded portion, a region in which a bonded surface of the base wafer is exposed is generated around the SOI layer after delamination, and such a region is referred to as a terrace portion.

Next, as shown in FIG. 1(f), treatment that removes the outer periphery of the buried oxide film 14 is performed in such a way as to obtain a structure in which a peripheral end of the SOI layer 16 of the SOI wafer 15 is located outside a peripheral end of the buried oxide film 14.

The amount of the removed outer periphery of the buried oxide film 14 is not limited to a particular amount as long as the overhanging structure described above is obtained. For example, by removing the width wider than the width of the SOI layer 16 by which the SOI layer 16 is to be reduced by etching at the time of heat treatment in subsequent processes, it is possible to prevent reliably the buried oxide film 14 from being exposed by etching of the heat treatment.

At this time, the treatment that removes the outer periphery of the buried oxide film 14 is not limited to particular treatment, and, for example, it is preferable to perform the treatment by immersing the SOI wafer 15 in an aqueous solution containing HF.

The aqueous solution containing HF makes it possible to remove an end face of the outer periphery of the buried oxide film 14 efficiently by etching in such a way that the surface of the SOI layer 16 is etched as little as possible and makes it easy to obtain the above-described structure.

Next, as shown in FIG. 1(g), heat treatment is performed on the SOI wafer 15 in an epitaxial growth furnace, for example, in a reducing atmosphere containing hydrogen or an atmosphere containing hydrogen chloride gas.

By this flattening heat treatment, it is possible to improve the surface roughness of the SOI layer after delamination and remove a damaged layer. At this time, although etching of the end face of the outer periphery of the SOI layer proceeds and a predetermined width of the outer periphery of the SOI layer is removed by etching, in the present invention, since the outer periphery of the buried oxide film has been removed in advance to form an overhanging shape, the buried oxide film is not exposed on the periphery of the SOI layer.

Next, as shown in FIG. 1(h), an epitaxial layer 17 is formed on a surface of the SOI layer 16 of the SOI wafer 15.

At this time, for example, by supplying growth gas such as trichlorosilane ($SiHCl_3$) or dichlorosilane ($SiH_2Cl_2$) and hydrogen gas ($H_2$) as carrier gas to the SOI wafer set at a growth temperature, it is possible to grow a silicon epitaxial layer epitaxially.

Figure 2:
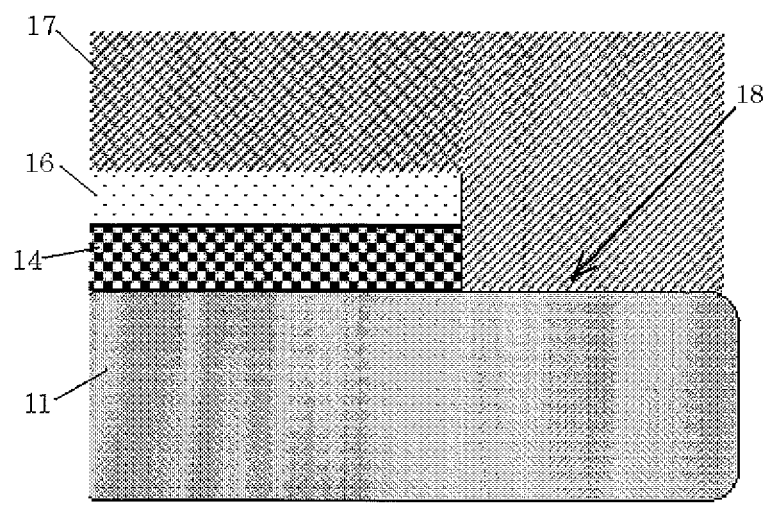
FIG. 2 is a schematic sectional view of part of an example of the SOI wafer manufactured by the method for manufacturing of an SOI wafer of the present invention.
Figure 3:
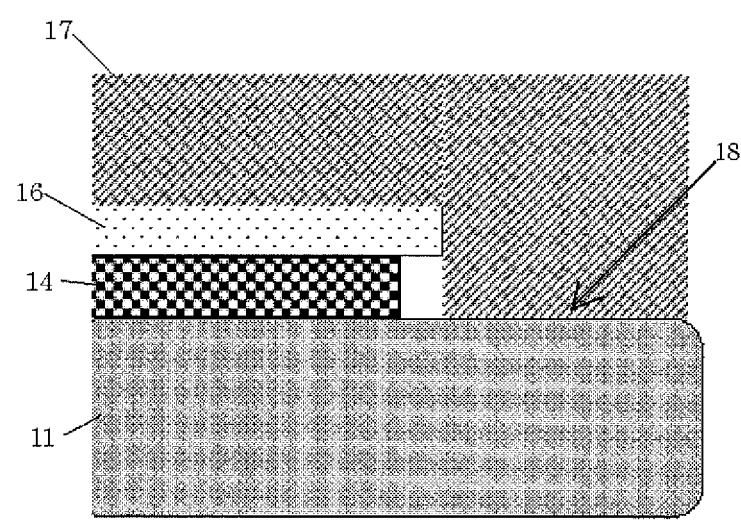
FIG. 3 is a schematic sectional view of part of another example of the SOI wafer manufactured by the method for manufacturing an SOI wafer of the present invention.

FIGS. 2 and 3 are schematic sectional views of part of the SOI wafers manufactured by the manufacturing method of the present invention. As shown in FIG. 2, since the terrace portion 18 and the epitaxial layer 17 grown from the SOI layer 16 grow continuously as one layer, an epi-valley is not formed, making it possible to obtain a high-quality thick-film SOI wafer in which no dust is generated. Moreover, as in FIG. 3, even in a structure (an overhanging shape) in which the peripheral ends of the SOI layer 16 and the buried oxide film 14 do not coincide with each other and the peripheral end of the SOI layer 16 is located outside the peripheral end of the buried oxide film 14, it is possible to perform epitaxial growth satisfactorily. At this time, a cavity is sometimes formed in a peripheral end portion of the buried oxide film 14, but this cavity has a minute size of several μm or less and does not affect subsequent processes.

Moreover, the above-described effect of the present invention can be obtained by another method for manufacturing an SOI wafer of the present invention, the method which will be described below.

Figure 4:
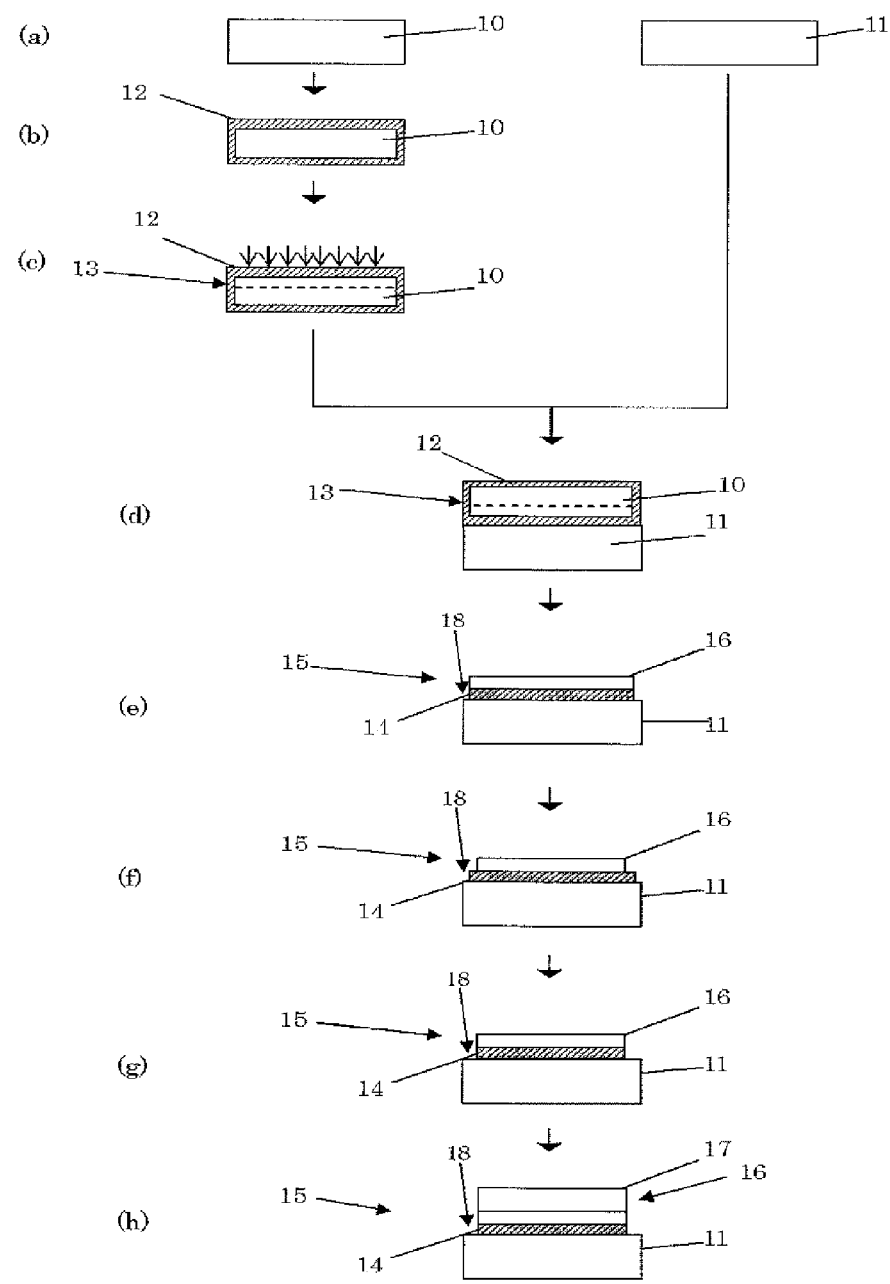
FIG. 4 is a flow diagram of an example of another method for manufacturing an SOI wafer of the present invention.

FIG. 4 is a flow diagram of an example of another method for manufacturing an SOI wafer of the present invention.

In the manufacturing method of the present invention in FIG. 4, processes of FIGS. 4(a) to (e), the processes of bonding the bond wafer 10 and the base wafer 11 and then performing delamination and thereby fabricating the SOI wafer 15, can be performed in the same manner as the processes of FIGS. 1 (a) to (e).

Then, as shown in FIG. 4(f), heat treatment is performed on the SOI wafer 15 in a reducing atmosphere containing hydrogen or an atmosphere containing hydrogen chloride gas. By this heat treatment, a surface of the SOI layer 16 is flattened and the outer periphery thereof is etched, and an outer periphery of the buried oxide film 14 is exposed.

Next, as shown in FIG. 4(g), treatment that removes the buried oxide film 14 exposed on the periphery of the SOI layer 16 of the SOI wafer 15 is performed.

In this case, it is necessary simply to remove a portion exposed on at least the periphery of the buried oxide film 14, and, as in FIG. 3, removal may be further performed to obtain a structure in which the peripheral end of the SOI layer 16 is located outside the peripheral end of the buried oxide film 14.

Moreover, a method for removing the exposed portion of the buried oxide film 14 is not limited to a particular method, and, for example, by performing the removal by immersing the SOI wafer 15 in an aqueous solution containing HF, it is possible to perform removal by etching efficiently.

Then, as shown in FIG. 4(h), an epitaxial layer 17 is formed on a surface of the SOI layer 16.

Since the exposed portion of the buried oxide film 14 was removed in the previous process, the epitaxial layer 17 is formed satisfactorily as in FIGS. 2 and 3, making it possible to prevent generation of an epi-valley.

With the above-described method for manufacturing an SOI wafer of the present invention, it is possible to manufacture a high-quality thick-film SOI wafer by satisfactory epitaxial growth.

EXAMPLE

Hereinafter, the present invention will be described more specifically by examples and comparative examples, but the present invention is not limited to these examples.

Example 1

An SOI wafer was manufactured by the processes of FIGS. 1(a) to (h).

First, as a bond wafer and a base wafer, silicon single crystal wafers having a diameter of 300 mm and crystal orientation <100> were prepared. An oxide film having a thickness of 150 nm was formed only on the bond wafer. Next, by performing ion implantation of hydrogen ($H^+$) through the oxide film of the bond wafer (implantation conditions: 40 keV, $5 \times 10^{16}$ atoms/cm$^2$), an ion implanted layer was formed inside the bond wafer. Then, the wafers were bonded together at room temperature, and delamination heat treatment was performed at 500° C. for 30 minutes in an atmosphere of argon to delaminate the bond wafer, whereby an SOI wafer (SOI layer/BOX layer=300 nm/150 nm) with no oxide film in a terrace portion was fabricated.

Next, the SOI wafer thus fabricated was immersed in a 15% aqueous HF solution, and the BOX layer was etched. As a result, a peripheral end of the BOX layer was formed 5 μm inside a peripheral end of the SOI layer.

Then, by performing heat treatment (HCl etching) inside an epitaxial growth furnace at 1100° C. for 5 minutes in an atmosphere containing hydrogen chloride gas (HCl=0.5 SLM, $H_2$=50 SLM), a surface of the SOI layer was etched to an etching margin of 185 nm. At this time, the BOX layer was not exposed on the periphery of the SOI layer of the SOI wafer subjected to heat treatment.

Next, on the SOI layer of the SOI wafer, an epitaxial layer was grown to a film thickness of 4 μm at 1080° C. for 4 minutes by using dichlorosilane as the raw material gas.

Figure 5:
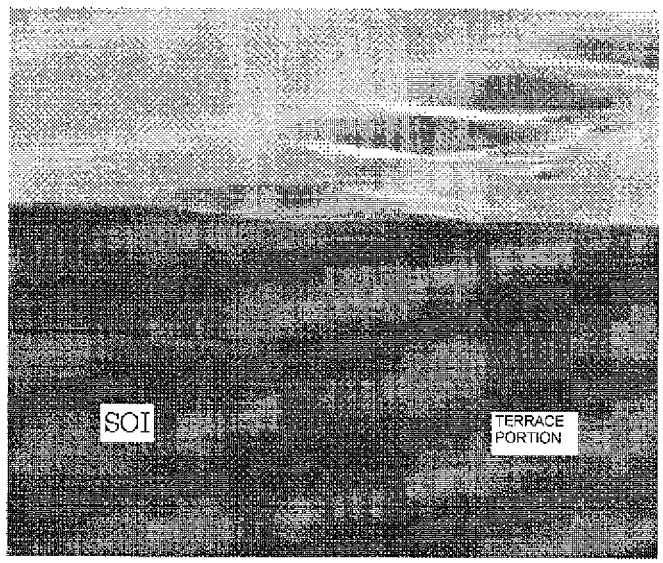
FIG. 5 is a SEM photograph of an SOI wafer manufactured in Example 1.

A SEM photograph of a boundary portion of the SOI layer and the terrace portion of the SOI wafer manufactured in the manner described above is shown in FIG. 5. As shown in FIG. 5, there is almost no step in the boundary portion of the SOI layer and the terrace portion, suggesting that it was possible to perform satisfactory epitaxial growth.

Comparative Example 1

An SOI wafer was manufactured in the same manner as Example 1 without performing removal of the outer periphery of the BOX layer by etching (FIG. 1(f)) before heat treatment (HCl etching).

Figure 8:
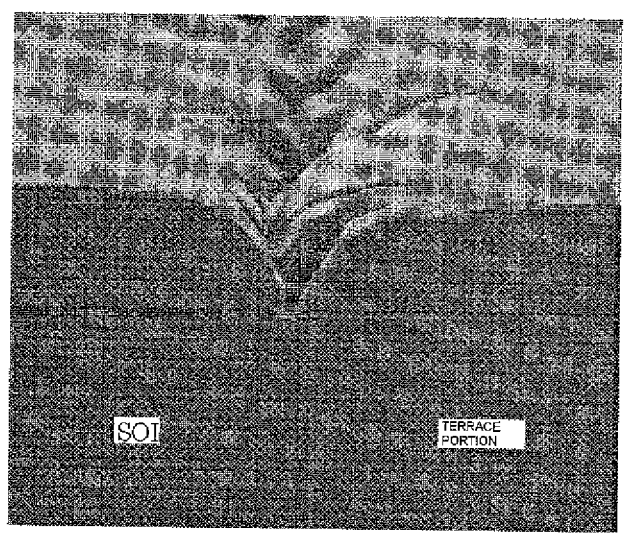
FIG. 8 is a SEM photograph of an SOI wafer manufactured in Comparative Example 1.

In FIG. 8, a SEM photograph of a boundary portion of the SOI layer and the terrace portion of the manufactured SOI wafer is shown.

As shown in FIG. 8, a valley-shaped step (an epi-valley) was formed in the boundary portion of the SOI layer and the terrace portion. Such an epi-valley causes particle contamination in subsequent processes.

Example 2

An SOI wafer was manufactured by the processes of FIGS. 4(a) to (h).

First, as a bond wafer and a base wafer, silicon single crystal wafers having a diameter of 300 mm and crystal orientation <100> were prepared. An oxide film having a thickness of 150 nm was formed only on the bond wafer. Next, by performing ion implantation of hydrogen ($H^+$) through the oxide film of the bond wafer (implantation conditions: 40 keV, $5 \times 10^{16}$ atoms/cm$^2$), an ion implanted layer was formed inside the bond wafer. Then, the wafers were bonded together at room temperature, and delamination heat treatment was performed at 500° C. for 30 minutes in an atmosphere of argon to delaminate the bond wafer, whereby an SOI wafer (SOI layer/BOX layer=300 nm/150 nm) with no oxide film in a terrace portion was fabricated.

Next, by performing heat treatment (HCl etching) at 1100° C. for 5 minutes in an atmosphere containing hydrogen chloride gas (HCl=0.5 SLM, $H_2$=50 SLM), a surface of the SOI layer was etched to an etching margin of 185 nm. As a result, a 3-μm portion of the outer periphery of the BOX layer was exposed in the terrace portion (the whole circumference of the SOI layer).

Then, by immersing the SOI wafer in a 15% aqueous HF solution, the exposed BOX layer was etched. As a result, a peripheral end of the BOX layer was formed in almost the same position as a peripheral end of the SOI layer.

Next, on the SOI layer of the SOI wafer, an epitaxial layer was grown to a film thickness of 4 μm at 1080° C. for 4 minutes by using dichlorosilane as the raw material gas.

Figure 6:
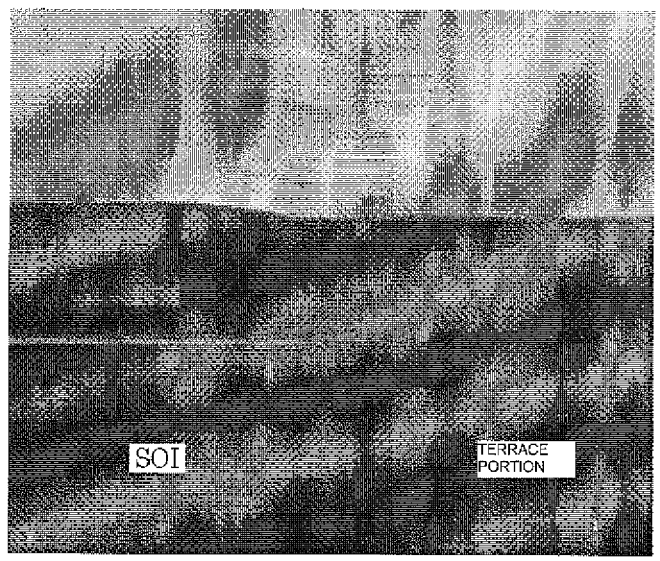
FIG. 6 is a SEM photograph of an SOI wafer manufactured in Example 2.
Figure 7:
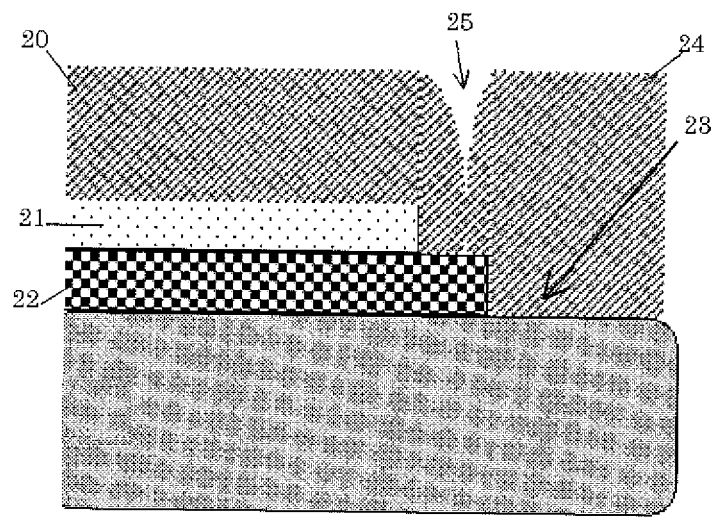
FIG. 7 is a schematic sectional view of part of an SOI wafer manufactured by a conventional method for manufacturing an SOI wafer.

A SEM photograph of a boundary portion of the SOI layer and the terrace portion of the SOI wafer manufactured in the manner described above is shown in FIG. 6. As shown in FIG. 6, a step was not formed in the boundary portion of the SOI layer and the terrace portion, suggesting that it was possible to perform satisfactory epitaxial growth.

Comparative Example 2

An SOI wafer was manufactured in the same manner as Example 2 without performing removal of the outer periphery of the BOX layer by etching (FIG. 4(g)) after heat treatment (HCl etching).

A SEM photograph of the boundary portion of the SOI layer and the terrace portion of the SOI wafer thus manufactured also revealed that an epi-valley was formed as in FIG. 8 of Comparative Example 1.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing an SOI wafer, the method by which a silicon oxide film is formed on a surface of a bond wafer made of a silicon single crystal, an ion implanted layer is formed inside the bond wafer by implanting at least one gas ion of a hydrogen ion and a rare gas ion through the silicon oxide film, and, after an ion implanted surface of the bond wafer and a surface of a base wafer made of a silicon single crystal are bonded through the silicon oxide film, the bond wafer is delaminated at the ion implanted layer to fabricate the SOI wafer having no oxide film in a terrace portion of a periphery of the base wafer and using the silicon oxide film as a buried oxide film, after heat treatment is performed on the SOI wafer in a reducing atmosphere containing hydrogen or an atmosphere containing hydrogen chloride gas, treatment that removes the buried oxide film exposed on a periphery of an SOI layer of the SOI wafer is performed and an epitaxial layer is then formed on a surface of the SOI layer.

2. The method for manufacturing an SOI wafer according to claim 1, wherein the treatment that removes the buried oxide film exposed on the periphery of the SOI layer is performed by immersing the SOI wafer in an aqueous solution containing HF.

* * * * *